United States Patent [19]
Sur, Jr. et al.

[11] Patent Number: 5,764,563
[45] Date of Patent: Jun. 9, 1998

[54] THIN FILM LOAD STRUCTURE

[75] Inventors: Harlan Lee Sur, Jr., San Leandro; Subhas Bothra, San Jose, both of Calif.

[73] Assignee: VLSI Technology, Inc., San Jose, Calif.

[21] Appl. No.: 723,007

[22] Filed: Sep. 30, 1996

[51] Int. Cl.$^6$ ................................................. G11C 11/00
[52] U.S. Cl. ........................... 365/154; 365/174; 257/530; 257/379
[58] Field of Search ............................. 365/154, 156, 365/174; 257/530, 379

[56] References Cited

U.S. PATENT DOCUMENTS

| | | | |
|---|---|---|---|
| 4,174,521 | 11/1979 | Neale | 357/45 |
| 4,420,766 | 12/1983 | Kaston | 357/59 |
| 4,441,167 | 4/1984 | Principi | 365/94 |
| 4,532,609 | 7/1985 | Iizuka | 365/154 |
| 4,538,167 | 8/1985 | Yoshino et al. | 357/59 |
| 5,070,384 | 12/1991 | McCollum et al. | 357/51 |
| 5,106,773 | 4/1992 | Chen et al. | 437/51 |
| 5,191,241 | 3/1993 | McCollum et al. | 307/465 |
| 5,210,598 | 5/1993 | Nakazaki et al. | 257/530 |
| 5,233,206 | 8/1993 | Lee et al. | 257/50 |
| 5,248,632 | 9/1993 | Tung et al. | 437/195 |
| 5,258,891 | 11/1993 | Sako | 361/792 |
| 5,266,829 | 11/1993 | Hamdy et al. | 257/530 |
| 5,272,666 | 12/1993 | Tsang et al. | 365/96 |
| 5,293,133 | 3/1994 | Birkner et al. | 327/525 X |
| 5,489,796 | 2/1996 | Harward | 257/379 |
| 5,493,146 | 2/1996 | Pramanik et al. | 257/530 |
| 5,502,315 | 3/1996 | Chua et al. | 257/530 |
| 5,515,313 | 5/1996 | Yamaguchi et al. | 365/156 |

*Primary Examiner*—David C. Nelms
*Assistant Examiner*—Huan Hoang
*Attorney, Agent, or Firm*—Hickman Beyer & Weaver

[57] ABSTRACT

A resistive load structure and method for making a resistive load structure for an integrated circuit includes the use of an amorphous silicon "antifuse" material. The resistive load structure can be used in an SRAM cell to provide a load to counteract charge leakage at the drains of two pull-down transistors and two pass transistors of the SRAM cell. The resistive load structure is advantageously formed by depositing an amorphous silicon pad over a conductive via, and the resistance of the resistive load structure is controlled by adjusting the thickness of the amorphous silicon pad and varying the diameter of the underlying conductive via.

25 Claims, 6 Drawing Sheets

THIN FILM LOAD STRUCTURE

BACKGROUND OF THE INVENTION

The present invention relates generally to resistive loads formed in semiconductor devices, and more particularly, to resistive load structures used in memory cells.

In the semiconductor industry, there is a general need to make semiconductor devices physically smaller, faster, and less expensive to manufacture. In response to this need, semiconductor manufactures have made numerous improvements through the use of more efficient routing arrangements, better performing materials and improved packaging structures.

As is well known in the art, semiconductor memory devices are typically manufactured in large arrays. By way of example, a static random access memory (SRAM) is one type of memory device generally having an array of $2^n$ by $2^m$ individual SRAM cells. In turn, each SRAM cell is coupled to wordlines (rows), and complementary bit lines (columns) to enable appropriate programming.

Although there has been much research and development associated with producing high performance SRAM memory cells, the basic SRAM cell design has essentially remained unchanged. Consequently, as more individual SRAM cells are packed onto a silicon chip to form a more dense SRAM array, the overall physical size of the array continues to increase. When this happens, the large physical size of the SRAM array will prevent its implementation in designs having strict size constraints. Therefore, designers who need a lot of memory for their electronic equipment may be forced to enlarge the size of their products in order to accommodate larger memory cell designs.

Generally, there are a variety of circuit layouts suitable for designing SRAM cells. Standard SRAM cell designs have two cross-coupled inverters, including two p-type transistors ("pull-up devices"), two n-type transistors ("pull-down devices"), and two pass transistors for a total of six transistors. As a result, some space conscience designers have replaced the two p-type transistors with polysilicon resistors, reducing the transistor count to four. In operation, the two p-type transistors (of the standard design) or the polysilicon resistors (of the modified design) act as a load (pull-up devices) to counteract charge leakage at the drains of the two n-type transistors and the two pass transistors.

FIG. 1 is a circuit diagram of a prior art high resistance SRAM cell 100 having a pair of n-type transistors 106 and 104. Transistors 106 and 104 have gates that are connected to nodes 109 and 107, respectively. A load resistor 110, connects node 109 to a power supply (Vdd) 101 through a power supply node 103. A load resistor 108 connects node 107 to power supply 101. A pass transistor 114 connects node 109 to a data line 118. A pass transistor 112 connects node 107 to a complementary data line 116. The gates of each pass transistor 114 and 112 are connected to a wordline 120, and each of the transistors 104 and 106 are connected to ground (Vss) 102.

Although the substitution of polysilicon load resistors 108 and 110 for the p-type transistors of traditional prior art SRAM cells has somewhat reduced the physical size of an SRAM cell, additional process fabrication operations are typically required to manufacture the polysilicon resistor structures. Additionally, the resistive values of a polysilicon resistor structures are directly related to the length and width of the polysilicon material. Consequently, the use of polysilicon resistor structures may actually increase the silicon surface area required for an SRAM cell.

FIG. 2 is a cross-sectional view of a portion of an integrated circuit embodying the schematic design of the prior art high resistance SRAM cell 100 of FIG. 1. This cross-section illustrates the increased number of process operations required to layout SRAM cell 100 having a polysilicon resistor 108. As shown, a substrate 130 (such as a silicon wafer) is provided with a pair of field oxide ($SiO_2$) regions 132 and a gate oxide 134. Gate oxide 134 is thermally grown and patterned over substrate 130 and portions of the pair of field oxide regions 132. A polysilicon gate 106 is deposited over gate oxide 134, such as by using conventional chemical vapor deposition (CVD) techniques, and is then patterned. Once patterned, a layer of oxide or nitride is blanket deposited and etched back to form spacers 135.

Next, a dielectric layer 136 of silicon dioxide ($SiO_2$) is blanket deposited over polysilicon gate 106 and spacers 135, such as by using conventional TEOS deposition techniques. Next, a contact hole 137 is formed in dielectric layer 136 so that a layer of polysilicon material 138 that is subsequently deposited over dielectric layer 136 comes in contact with polysilicon gate 106. Typically, an implant operation follows where polysilicon material 138 is doped with impurities such as phosphorous and arsenic. Once polysilicon material 138 is patterned, a dielectric layer 140 is blanket deposited over polysilicon material 138 and other exposed areas. Next, a conductive contact 144 is formed in dielectric layer 140, which leads to a patterned metallization line 146.

The resulting structure includes a polysilicon resistor 108 formed of polysilicon material 138. As described above, the resistance of polysilicon resistor 108 is partially controlled by the physical width (W) of polysilicon material 138, since the current flows along the width of the resistor. Consequently, as increased resistive loads are needed, the width W must increase, and therefore, the physical size of SRAM cell 100 will unfortunately increase in order to accommodate wider polysilicon material 138 lines. Further, as can be appreciated from the above described process operations, forming polysilicon resistor 108 over gate 106 requires numerous time consuming and complex processing operations in order to achieve the required level of resistance for SRAM cell 100.

In view of the foregoing, what is needed is a resistive load structure and method for making the load structure which conserves space and requires fewer processing operations. Preferably, the needed resistive load structure can be implemented in an SRAM memory device in order to achieve a more compact memory cell.

SUMMARY OF THE INVENTION

The present invention provides a resistive load structure and method for making a resistive load structure that is physically compact and which requires relatively few processing operations. In one embodiment, the resistive load structure can be used in an SRAM cell to provide a load to counteract charge leakage at the drains of two pull-down transistors and two pass transistors of the SRAM cell. The resistive load structure is preferably formed by depositing an amorphous silicon pad over a conductive via. In this embodiment, the resistance of the resistive load structure is controlled by adjusting the thickness of the amorphous silicon pad and varying the diameter of the underlying conductive via. Advantageously, due to the relatively small physical size of the amorphous silicon pad, the overall layout of an SRAM cell can be substantially reduced while eliminating additional costly processing operations.

In another embodiment, a static random access memory cell is disclosed. The memory cell generally includes a first inverter having a first amorphous silicon resistor connected to a first transistor at a first node. The memory cell further includes a second inverter having a second amorphous silicon resistor connected to a second transistor at a second node. The first and second inverters are cross coupled, and the first node being coupled to a control gate of the second transistor and the second node being coupled to a control gate of the first transistor. Preferably, the amorphous silicon transistors are amorphous silicon "pads" having a resistance of at least $1 \times 10^4$ ohms.

In yet another embodiment, a method for making a thin film load device is disclosed. The process includes the operations of: (a) providing a substrate having a first electrically conductive feature; (b) forming an insulating layer over the first electrically conductive feature; (c) providing a conductive via through the insulating layer in electrically conductive contact with the first electrically conductive feature; (d) depositing an amorphous silicon material having a resistivity of at least $1 \times 10^4$ ohms over and in electrically conductive contact with the conductive via; and (e) forming a second electrically conductive feature over and in electrically conductive contact with the antifuse material. The antifuse material provides a resistive load between the first and second electrically conductive features.

Advantageously, the amorphous silicon resistive load structures are efficiently made using conventional antifuse technology processes, and requires substantially fewer processing operations to construct than polysilicon resistors of the prior art. Further, the compact size of the amorphous silicon "pads" allow their formation over existing conventional conductive vias. Therefore, the efficient fabrication of the amorphous silicon resistive load structures of the present invention makes them particularly suitable for implementation in SRAM memory cells. Therefore, using the resistor structure of the present invention decreases the size of SRAM memory cells and increases the potential density of the SRAM memory device.

These and other advantages of the present invention will become apparent upon reading the following detailed descriptions and studying the various figures of the drawings.

DETAILED DESCRIPTION OF THE PREFERRED EMBODIMENTS

Figure 1:
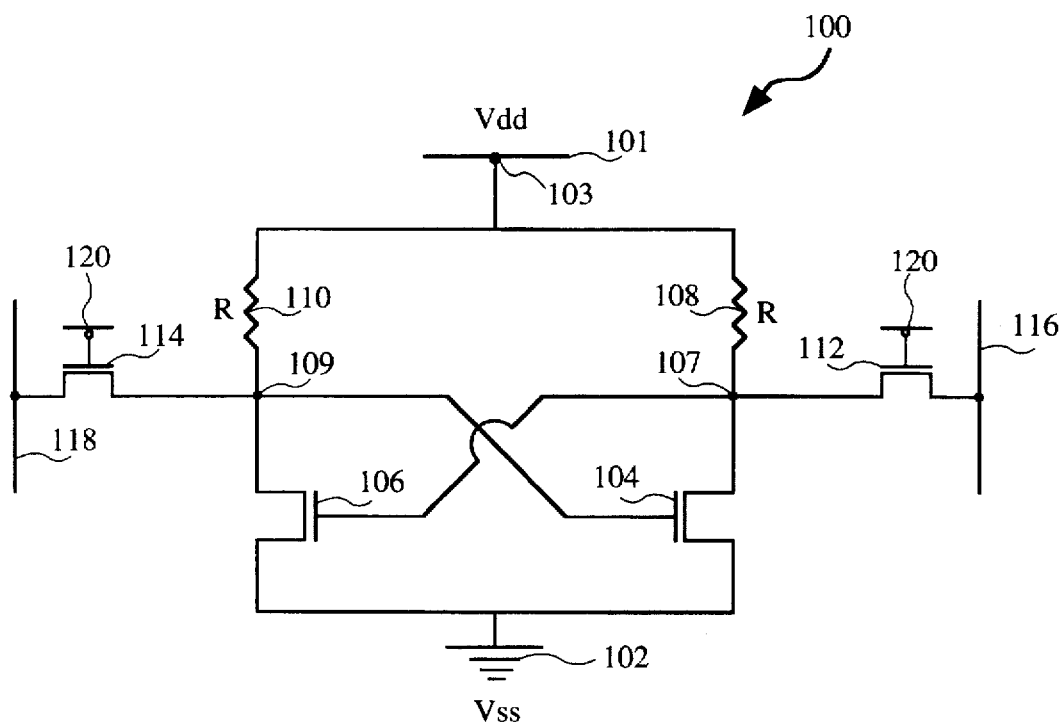
FIG. 1 is a circuit diagram of a prior art resistor load SRAM cell.
Figure 2:
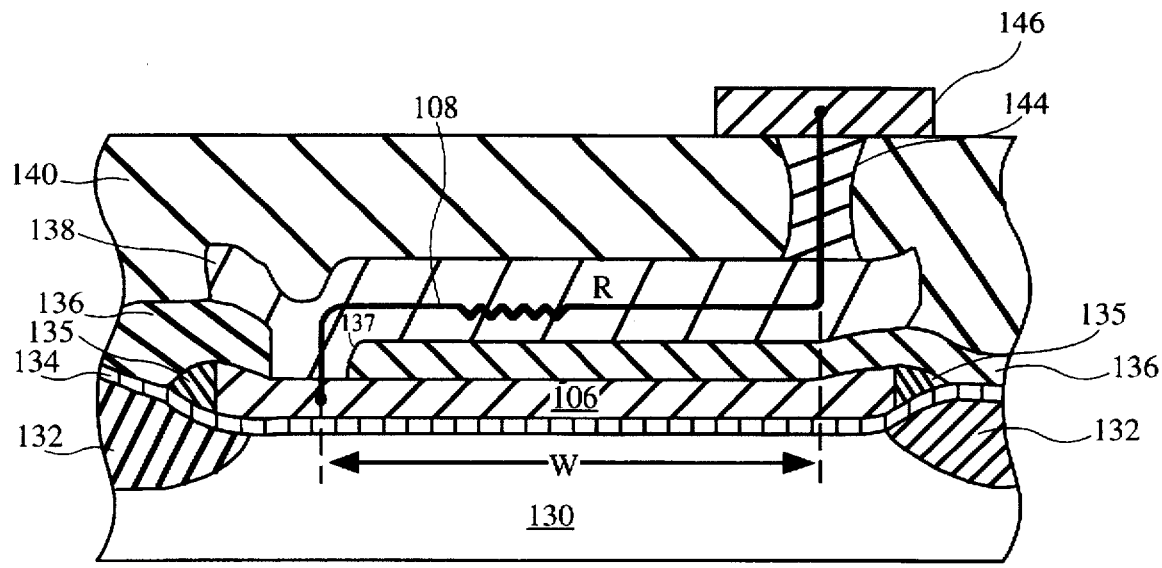
FIG. 2 is a cross-sectional view of a prior art integrated circuit structure including polysilicon resistive load.

FIGS. 1 and 2 were previously described with reference to prior art SRAM cells. In particular, the disadvantages of physically larger and more process intensive polysilicon resistive load structures were described.

The present invention is directed at a resistive load structure for integrated circuits and method for making a resistive load structure for integrated circuits. In a preferred embodiment, the resistive load structure is used in an SRAM cell to provide a load to counteract charge leakage at the drains of two pull-down transistors and two pass transistors of the cell. The resistive load structure is preferably formed by depositing an amorphous silicon pad over a conductive via. In this embodiment, the resistance of the resistive load structure is controlled by adjusting the thickness of the amorphous silicon pad and varying the diameter of the underlying conductive via. As a result, the physical size of an SRAM cell can be reduced while eliminating processing complexities associated with the prior art resistive load structures.

Figure 3A:
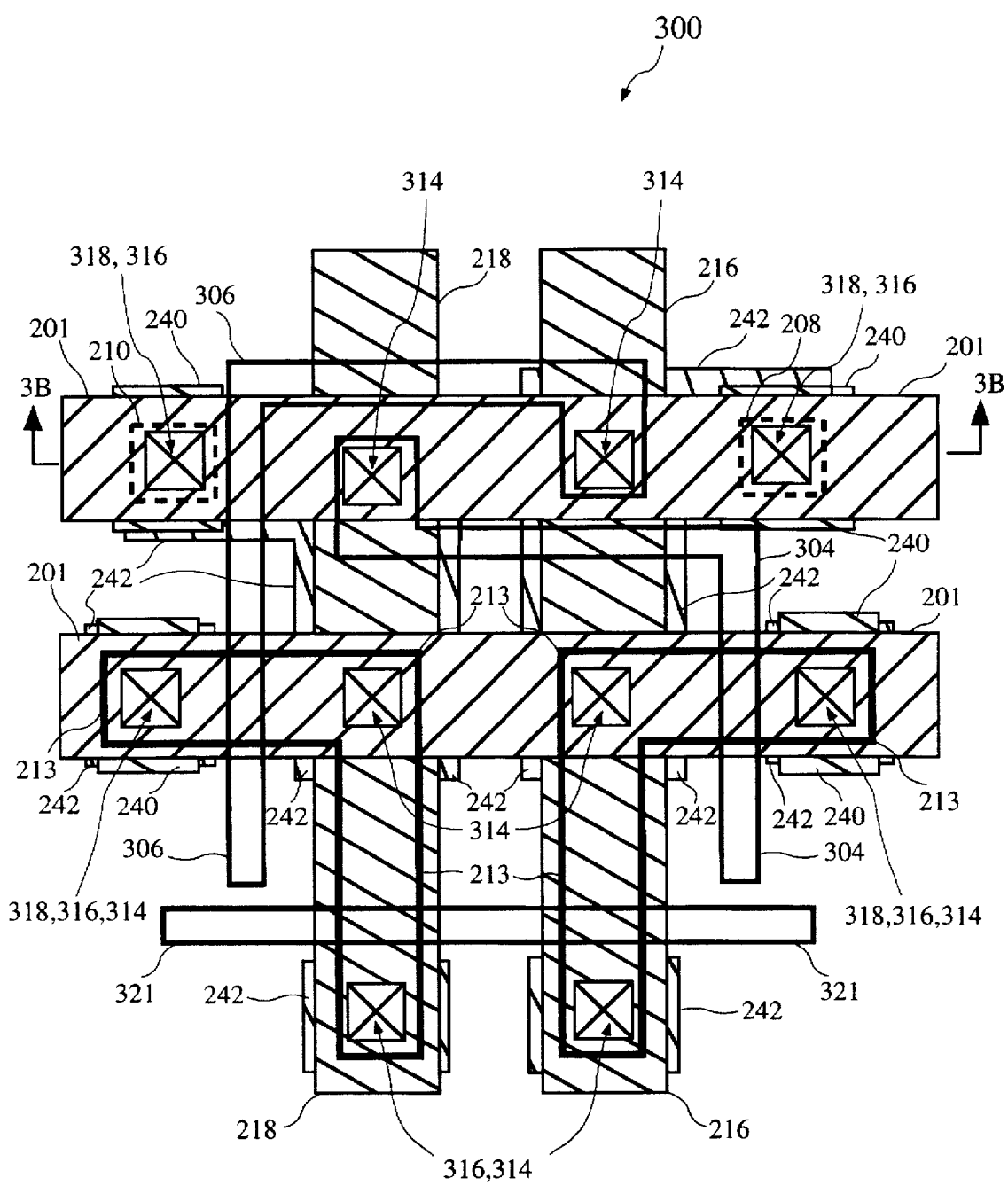
FIG. 3A is a silicon level layout of an SRAM cell having amorphous silicon resistive loads in accordance with a preferred embodiment of this invention.

FIG. 3A is a silicon level layout of an SRAM cell 300 using amorphous silicon resistive loads 208 and 210. Polysilicon lines 304 and 306 are patterned over a thermally grown gate oxide material (not shown) that lies over a substrate. In this embodiment, polysilicon lines 304 and 306 define the gates for the two n-type transistors (e.g., transistors 106 and 104 of FIG. 1) in the cross-coupled inverter circuit. Further, another polysilicon line 321 defines the gates for the two pass transistors (e.g., transistors 114 and 112 of FIG. 1) which are in turn coupled to a wordline.

As is well known in the art, if SRAM cell 300 is fabricated using a p-type substrate, the diffusion regions will preferably be n-type diffusion regions. In this example, n-type impurities are preferably implanted in the form of two opposite facing L-shapes 213. In this manner, transistor gates are appropriately formed when the above described polysilicon lines 304, 306 and 321 are deposited and patterned using conventional photolithography processes.

In this embodiment, there are three levels of patterned metallization lines used for the interconnections of the SRAM cell. By way of example, a first metallization line 242 is patterned in an L-shape pattern which in part interconnects to polysilicon gates 304 and 306 and n-type diffusion regions 213 through conductive vias 314. A second metallization line 240 is in turn interconnected to first metallization line 242, which also provides electrical interconnection to polysilicon gates 304 and 306 through conductive via 314. On the same level as second metallization line 240, there are two parallel second metallization lines 216 and 218 which functionally provide SRAM cell 300 with a DATA line and a complementary DATA line.

As will be described in greater detail below, conductive vias 314, 316, and 318 are formed within various dielectric layers that serve to electrically isolate the metallization lines during operation. By way of example, conductive via 314 is the lowest via which provides electrical interconnection between polysilicon gates 304, 306, diffusion regions 213, and first metallization lines 242. Similarly, conductive via 316 is a mid-level via designed to provide electrical interconnection between first metallization lines 242 and second metallization lines 240, 216 and 218 and conductive via 318 provides electrical interconnection between second metallization lines 240 and a third metallization line 201.

In this embodiment, before third metallization lines 201 are deposited and patterned over a topmost layer of dielectric material and underlying conductive vias, resistive load structures are defined. By way of example, to form resistive load structures 208 and 210, a layer of amorphous silicon is blanket deposited and patterned to leave "pads" of amorphous silicon material where resistive load structures 208 and 210 lie. In this manner, resistive load structures can be efficiently formed over underlying conductive vias without having to allocate larger substrate surface area in order to accommodate the required resistive load requirements. Additionally, forming an amorphous silicon pad over a conductive via eliminates having to fabricate multi-level structures simply to construct a resistive load.

Although resistive load structures 208 and 210 can be adjusted to have any number resistive values that depend on the particular application, for SRAM cell 300, the resistance of resistive load structures 208 and 210 are controlled by varying the thickness of each pad and varying the diameter of the underlying conductive via. By way of example, the thickness of an amorphous silicon pad is preferably between about 200 Å and 2,000 Å, and more preferably between about 500 Å and 1,200 Å, and most preferably about 800 Å. The diameter of an underlying conductive via is selected to be between about 2,000 Å and 20,000 Å, and more preferably between about 3,000 Å and 6,000 Å, and most preferably about 4,500 Å.

Therefore, for these preferred parameters, the resistive value of resistive load structures 208 and 210 is preferably between about $1\times10^4$ and $1\times10^{14}$ ohms, and more preferably between about $1\times10^8$ and $1\times10^{13}$, and most preferably about $1\times10^{11}$. Although physical dimensions and resistive values have been provided for illustrative purposes, it should be understood that the above described values will vary depending upon the resistive values needed for a particular application.

Figure 3B:
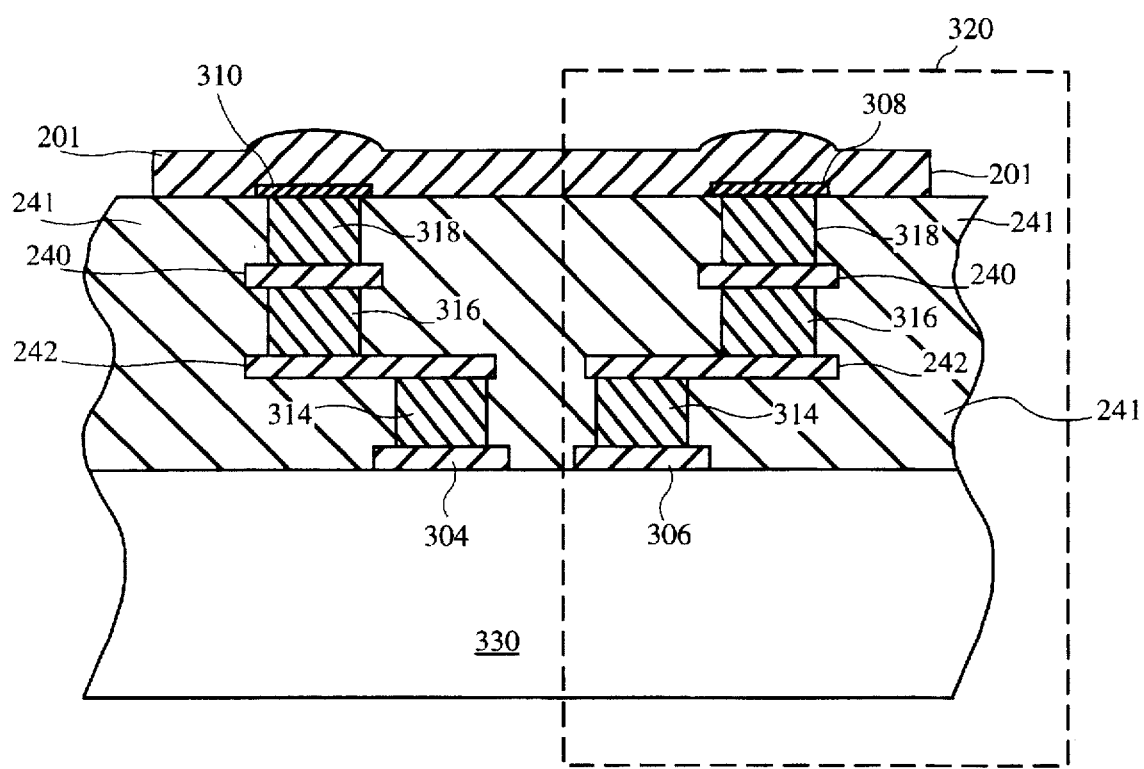
FIG. 3B is a cross-sectional view of a multi-layer interconnect structure taken along line 3B—3B of FIG. 3A.

FIG. 3B is a cross-sectional perspective of the multi-layer structure taken along line "3B—3B" in FIG. 3A. By way of example, a substrate 330 (such as a silicon wafer) is shown having patterned polysilicon lines 304 and 306 at locations where transistor gates are required to form SRAM cell 300. Isolating the various conductive layers is a dielectric layer 241 which is shown as a continuous layer. However, as well be described in greater detail below, dielectric layer 241 is typically formed in different layers each time a particular conductive feature has been deposited and patterned.

As described above, conductive vias 314 are shown connecting polysilicon lines 304 and 306 to first metallization lines 242, conductive vias 316 are shown connecting first metallization lines 242 to second metallization lines 240, and conductive vias 318 are shown connecting second metallization lines 240 to third metallization line 201. As illustrated, amorphous silicon pads are patterned over conductive vias 318 where resistive load structures 308 and 310 are desired in accordance with one embodiment of the present invention.

An amorphous silicon layer is blanket deposited and patterned to form pads 308 and 310 over conductive via 318.

As described above, the resistive values associated with amorphous silicon pads 308 and 310 are governed by the thickness of amorphous silicon pads 308 and 310, and the associated diameter of conductive vias 318. Next, a conductive metallization line 201 is patterned over dielectric material 241 so that it is in contact with amorphous silicon pads 308 and 310.

Of course, resistive load structures 308 and 310 can be located at other levels within the interconnection structure to meet other design specific applications other than SRAM cell 300. By way of example, the resistive load structures can easily be located over conductive via 314 or conductive via 316, thereby lying under and in electrical contact with first metallization lines 242 and second metallization lines 240 respectively.

Figure 4A:
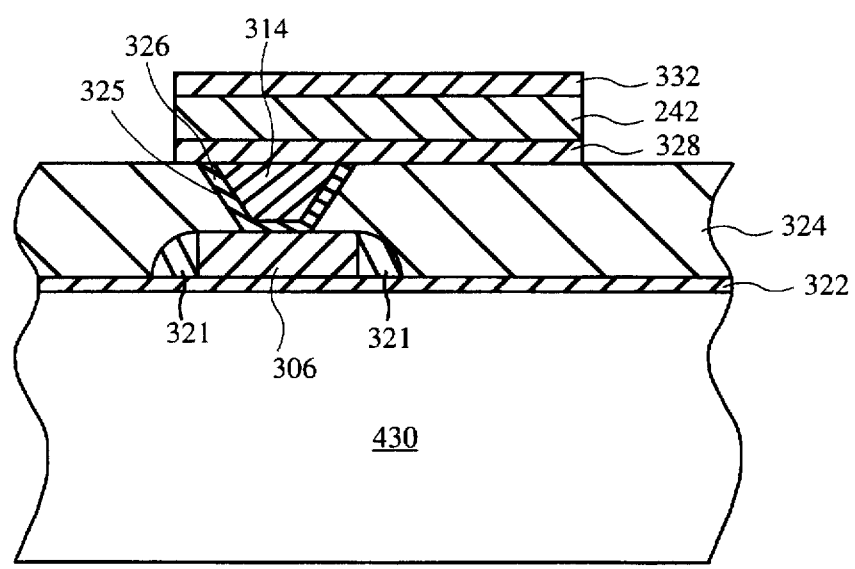
FIG. 4A is cross-sectional perspective of a partially fabricated interconnect structure in accordance with a preferred embodiment of this invention.

FIG. 4A is cross-sectional perspective of a partially fabricated interconnect structure used to form interconnections in SRAM cell 300 in accordance with another embodiment of the present invention. At an initial stage of the fabrication, a silicon substrate 430 is provided having the aforementioned diffusion regions (not shown for ease of illustration) that are used to form transistor drain and source regions. An oxide layer 322 (e.g., gate oxide) is then thermally grown over silicon substrate 430 to a preferred thickness of between about 50 Å and 200 Å, and more preferably, between about 75 Å and 100 Å, and most preferably, about 90 Å.

Once oxide layer 322 has been grown to the appropriate thickness, a layer of polysilicon is blanket deposited using a low pressure chemical vapor deposition (LPCVD) process and then patterned using conventional resist and photolithography technology. The resulting structure serves as a polysilicon gate 306. In this embodiment, the deposition process is preferably carried out at a pressure of between about 100 mTorr and 500 mTorr, and more preferably, between about 200 mTorr and 400 mTorr, and most preferably, at about 300 mTorr.

In this embodiment, in order to reduce the inherent resistiveness of the polysilicon material, a layer of tungsten silicide ($WSi_2$) is deposited (not shown) and patterned along with polysilicon gate 306. Preferably, the thickness of polysilicon gate 306 and the tungsten silicide layer is between about 500 Å and 2,000 Å, and more preferably, between about 750 Å and 1,500 Å, and most preferably, about 1,000 Å.

Once polysilicon gate 306 has been appropriately deposited and patterned, a thin layer of oxide is blanket deposited and then etched back to form oxide spacers 321 around polysilicon gate 306. Preferably, a plasma etch process or reactive ion etching (RIE) process is used to etch back the excess oxide material during the oxide spacer formation. In this manner, sharp edges that result after the polysilicon patterning process are appropriately rounded off.

Next, a dielectric layer 324 is blanket deposited over polysilicon gate 306 and oxide spacers 321 such that a preferred thickness of between about 5,000 Å and 12,000 Å is provided. More preferably, the thickness of dielectric layer 324 is between about 8,000 Å and 10,000 Å, and most preferably, about 9,000 Å. Although any suitable dielectric deposition technique can be used, dielectric layer 324 is preferably deposited using a TEOS silicon dioxide ($SiO_2$) deposition process.

Once dielectric layer 324 has been appropriately deposited, a via hole 325 is defined over polysilicon gate 306 such that a subsequently deposited conductive material can make electrical contact with polysilicon gate 306. In this embodiment, an initial glue layer 326 is deposited within the via hole's sidewalls as well as the bottom surface of the via hole which exposes the tungsten silicided layer overlying polysilicon gate 306.

The glue layer 326 is preferably a titanium nitride (TiN) layer which can be deposited using a chemical vapor deposition (CVD), a physical vapor deposition (PVD), or an ionized metal plasma (IMP) deposition technique. In this embodiment, glue layer 326 is preferably deposited using a CVD process carried out at a preferred pressure of between about 0.5 Torr and 5 Torr, and more preferably, a pressure of between about 1 Torr and 4 Torr, and most preferably 2.5 Torr. The thickness of glue layer 326 is preferably between about 300 Å and 1,000 Å, and more preferably, between about 400 Å and 700 Å, and most preferably, about 500 Å. Although TiN is a preferred material for glue layer 326, other suitable glue layers materials include tantalum nitride (TaN), titanium tungsten (TiW), titanium tungsten nitride (TiWN) and tungsten nitride (WN).

Next, the via hole is blanket deposited with a layer of tungsten (W) which is preferably deposited using a conventional chemical vapor deposition (CVD) process. The deposition pressure is preferably between about 50 Torr and 100 Torr, and more preferably, between about 70 Torr and 90 Torr, and most preferably about 80 Torr. Once the tungsten layer has been deposited, the excess glue layer 326 and tungsten layer material is etched back. In this manner, a conductive via 314 (e.g., tungsten plug) is in electrical contact with polysilicon gate 306.

At this stage, a barrier layer 328 of titanium nitride is blanket deposited over dielectric layer 324 and conductive via 314. Preferably, the thickness of barrier layer 328 is between about 300 Å and 1,000 Å, and more preferably, between about 400 Å and 700 Å and most preferably, about 500 Å. An aluminum metallization material is then sputter deposited over titanium nitride barrier layer 328 to form part of first metallization line 242 after a subsequent patterning operation. Preferably first metallization line 242 has a thickness of between about 4,000 Å and 10,000 Å, and more preferably, between about 6,000 Å and 8,000 Å, and most preferably, about 7,000 Å. Next, an additional titanium nitride (TiN) barrier layer 332 is blanket deposited over the aluminum metallization layer 242. At this point, barrier layers 328 and 332, and metallization layer 242 are patterned using conventional photolithography techniques which therefore define the appropriate metallization interconnect lines for the first metallization level associated with SRAM 300.

Figure 4B:
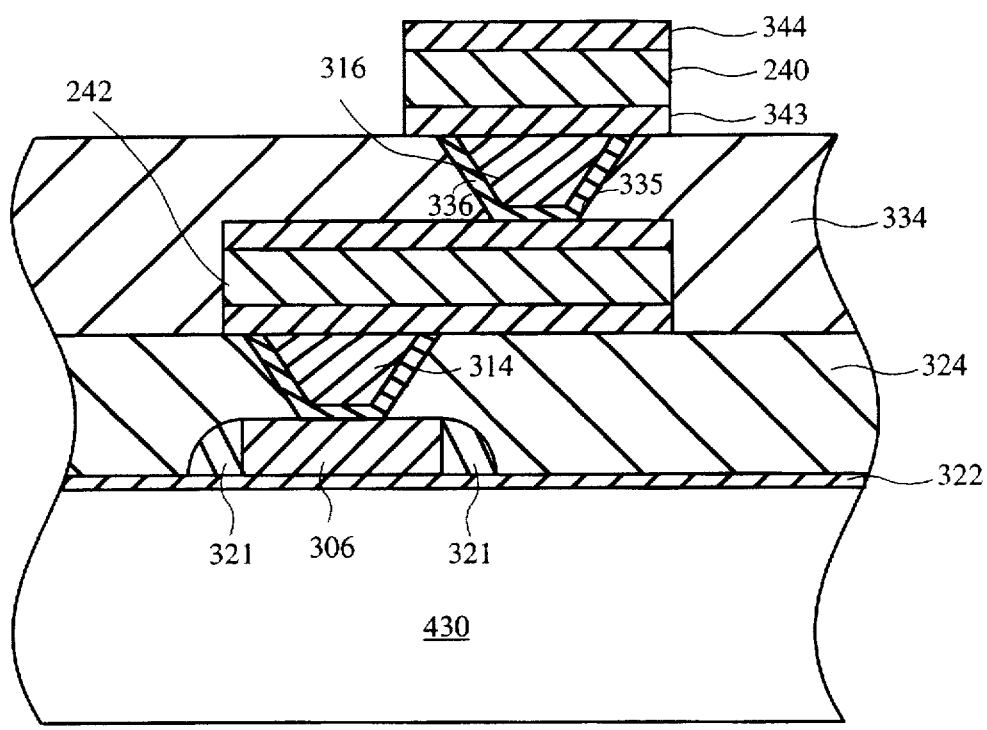
FIG. 4B shows a second metallization layer and conductive via formed over the partially fabricated interconnect structure of FIG. 4A in accordance with a preferred embodiment of this invention.

FIG. 4B shows an inter-metal oxide (IMO) dielectric layer 334 blanket deposited over first metallization 242 and a second conductive via 316 interconnecting first metallization lines 242 to a second metallization lines 240. In this embodiment, dielectric layer 334 is preferably deposited using a high density plasma (HDP) chemical vapor deposition (CVD) or a sub-atmospheric chemical vapor deposition (SACVD) process. Once dielectric layer 334 is blanket deposited, a planarization operation is performed.

By way of example, suitable planarization processes include chemical mechanical polishing (CMP), spin-on-glass (SOG) etchback or resist etchback. In this embodiment, a CMP process is preferably used to planarize dielectric layer 334. The CMP process generally involves the use of a polishing pad made from a synthetic material, such as polyurethane, and a polishing slurry which includes pH-balanced chemicals, such as sodium hydroxide, and silicon dioxide particles. A wafer having an uneven top surface is mounted on a polishing fixture such that the wafer is held by a vacuum and pressed against the polishing pad under high pressure. The polishing fixture then rotates and translates the wafers relative to the polishing pad. In this manner, the polishing slurry assists in the actual polishing of the dielectric layer 334.

After planarization, a via hole 335 is patterned into dielectric layer 334 such that a path is made to first metallization 242. As described above, the via hole is first preferably coated with a titanium nitride (TiN) layer 336 and then filled with tungsten (e.g., tungsten plug) to form conductive via 316. The excess tungsten material and titanium nitride material remaining over dielectric layer 334 is then etchedback.

Next, a titanium nitride barrier layer 343, a second metallization material and a titanium nitride barrier layer 344, are blanket deposited over dielectric 334. Subsequently, the three layers are patterned to form second metallization line 240 as described above. In this manner, appropriate interconnections are provided for SRAM cell 300.

Figure 4C:
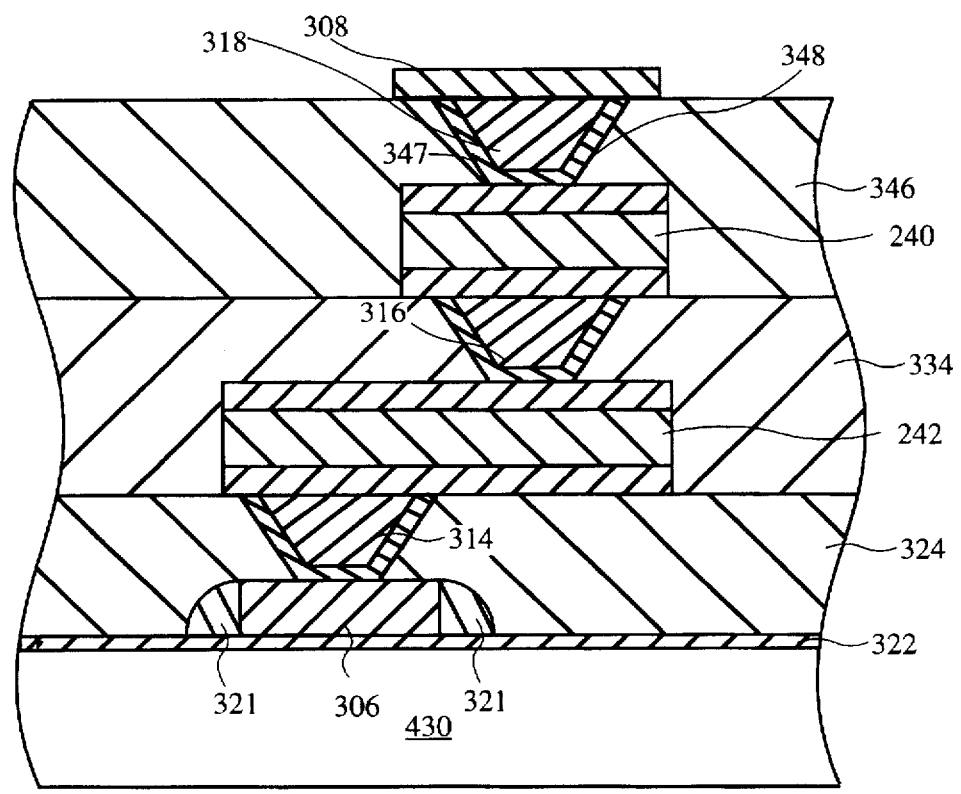
FIG. 4C shows the partially fabricated interconnect structure of FIG. 4B after an amorphous silicon layer is formed over a conductive via in accordance with a preferred embodiment of this invention.

FIG. 4C shows a third inter-metal oxide (IMO) dielectric layer 346 deposited over second metallization line 240. As described above, a planarization operation is preferably performed to remove the topographical variations from dielectric layer 346. Next, a via hole 347 is then patterned into dielectric layer 346 such that a path is made to second metallization line 240. The via hole is then coated with a titanium nitride (TiN) glue layer 348 and then filled with tungsten (e.g., tungsten plug) to form conductive via 318. The excess titanium nitride and tungsten material is then etchback to remove any excess material from over dielectric layer 346.

Next, a layer of amorphous silicon material is blanket deposited to the aforementioned thickness of between about 200 Å and 2,000 Å, and more preferably, between about 500 Å and 1,200 Å, and most preferably, about 800 Å. Preferably, the deposition process is carried out using a plasma enhanced chemical vapor deposition (PECVD) which is deposited at a preferred temperature of between about 150° C. and 600° C., and more preferably between about 200° C. and 400° C., and most preferably about 350° C. In this embodiment, the preferred power used in the PECVD process is between about 100 and 2,000 watts, and more preferably between about 500 and 1,000 watts, and most preferably about 850 watts. In addition, the preferred pressure is between about 0.5 and 10 Torr, and more preferably between about 2 Torr and 7 Torr, and most preferably about 5 Torr.

Preferably, the amorphous silicon materials are deposited using a silane gas (SiH$_4$). Typically, a nitrogen (N$_2$) or argon (Ar) carrier gas is also introduced into the chamber along with the silane gas during deposition. At this point, the amorphous silicon material is removed (e.g., patterned) from all surface areas not requiring a resistive load. In this manner, a resistive load structure 308 remains above conductive via 318. Advantageously, resistive load structure 308 was formed using conventional deposition and patterning technologies without the need for the costly multi-level polysilicon lines of FIG. 2.

Figure 4D:
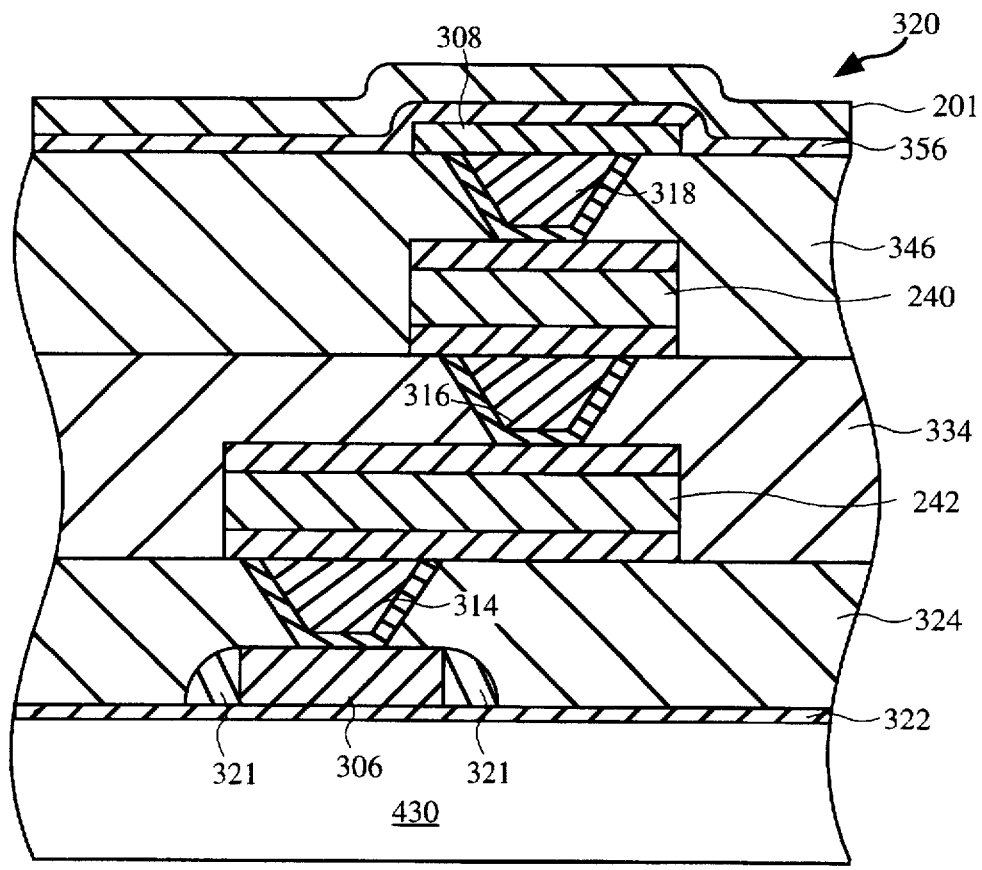
FIG. 4D shows the partially fabricated interconnect structure of FIG. 4C after a metallization layer is formed in contact with the amorphous silicon layer in accordance with a preferred embodiment of this invention.

FIG. 4D shows the structure of FIG. 4C after a titanium nitride barrier layer 356 is deposited over dielectric layer 346 and amorphous silicon resistive load structure 308. A third metallization material is then blanket deposited over barrier layer 356. The third metallization material and barrier layer 356 are then patterned using standard resist and photolithography processes to achieve the required routing lines for SRAM cell 300. In this manner, the third metallization lines 201 of FIG. 3A are produced. For ease of description, only section 320 of FIG. 3B has been described, however, it should be understood that corresponding layers are fabricated using similar process operations as described above.

Figure 5:
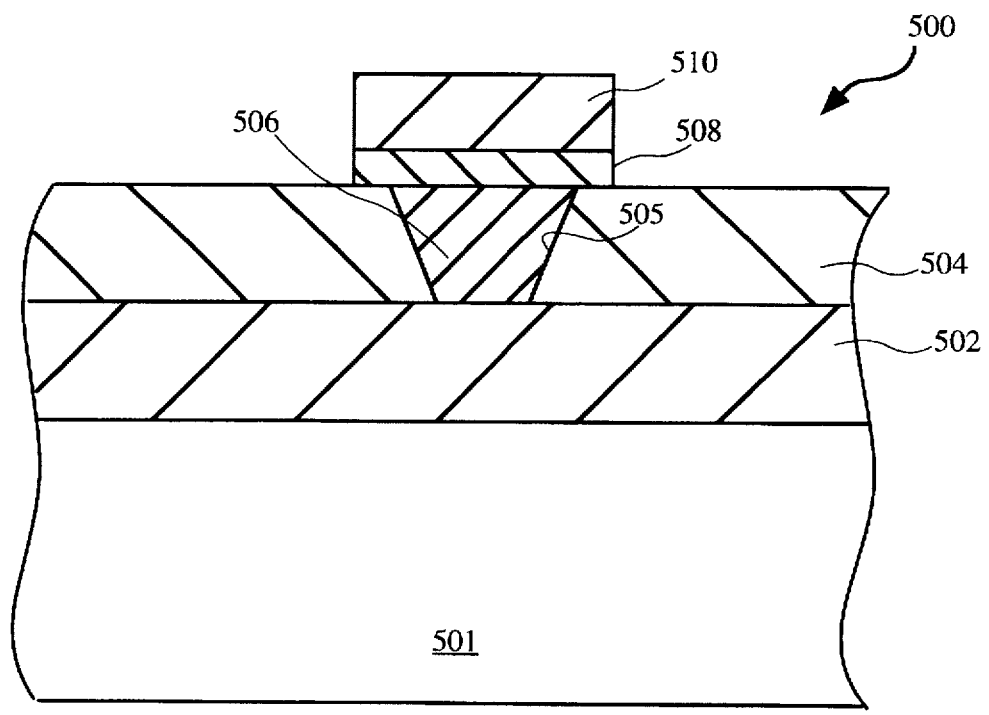
FIG. 5 shows a resistive load structure in accordance with yet another preferred embodiment of this invention.

FIG. 5 illustrates a resistive load structure in accordance with another embodiment of the present invention. In this embodiment, a resistive load structure 500 includes a first metallization line 502 patterned over a semiconductor substrate 501. A dielectric layer 504 is then blanket deposited over metallization line 502, and a via hole 505 is patterned into dielectric layer 504. In this manner, a path is defined down to first metallization line 502. Now, conductive material (e.g., tungsten) is deposited over dielectric layer 504 and into the via hole in order to form a conductive via 506.

After an etchback process is performed to remove any excess tungsten material, a amorphous silicon layer is deposited over dielectric layer 504 and conductive via 506. The amorphous silicon layer is then patterned such that a "pad" of amorphous silicon 508 remains over conductive via 506.

As described above, the thickness of the amorphous silicon material is a factor in setting the desired resistance for a resistive load structure. In one preferred embodiment, the thickness of amorphous silicon pad 508 is between about 200 Å and 2,000 Å, and more preferably, between about 500 Å and 1,200 Å, and most preferably about 800 Å. Another factor in determining the resistive load provided by amorphous silicon pad 508 is the diameter of the underlying conductive via.

Preferably, conductive via 506 has a preferred diameter of between about 2,000 Å and 20,000 Å, and more preferably, between about 3,000 Å and 6,000 Å, and most preferably about 4,500 Å. Once these physical dimensions are set, the resistive load values may be between about $1 \times 10^4$ and $1 \times 10^{14}$ ohms, and more preferably between about $1 \times 10^8$ and $1 \times 10^{13}$, and most preferably about $1 \times 10^{11}$. Of course, these values are merely exemplary, and will change depending on the particular application and resistive loads needed.

Figure 6:
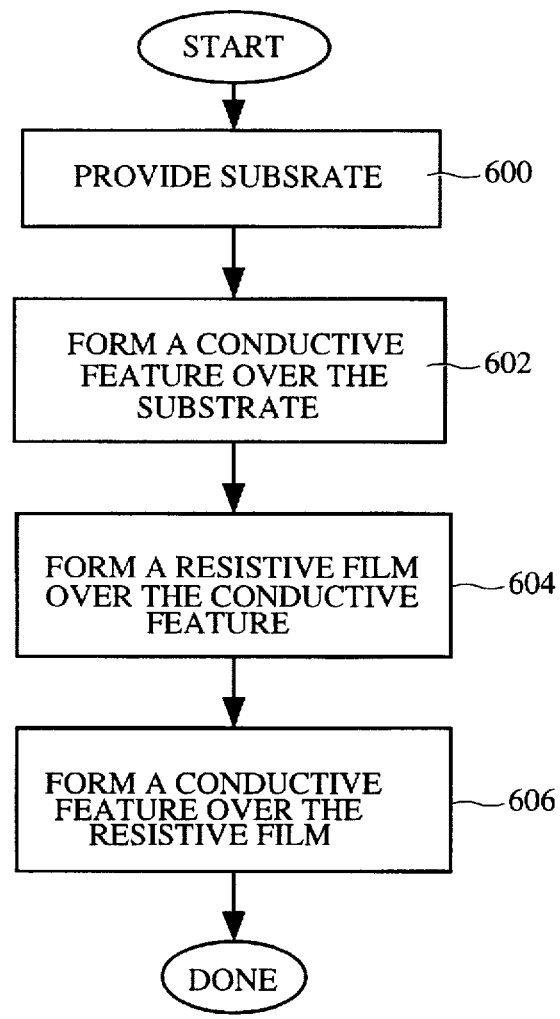
FIG. 6 is a flow chart illustration of a preferred method for forming resistive loads between conductive metallization features in accordance with one embodiment of the present invention.

FIG. 6 is a flow chart illustrating a preferred method for forming resistive loads between conductive metallization lines in accordance with one embodiment of the present invention. The process begins at an operation 600 where a substrate is provided. By way of example, the substrate will typically have previously diffused active regions, isolation regions, gate oxides, polysilicon gate regions, and dielectric layers. Thus, when, a resistive load is needed, the process will proceed to an operation 602 where a conductive feature is formed over the substrate.

By way of example, the conductive feature can be a metallization pattern or a polysilicon pattern. Generally, a dielectric material is then deposited over the conductive feature, and a conductive via is formed in the dielectric material leading to the underlying conductive feature. From operation 602, the method proceeds to an operation 604 where a resistive film is blanket deposited and patterned over the dielectric material and the conductive via leaving "pads" of resistive film over the conductive via. In one embodiment, the resistive film is preferably an amorphous silicon material having a thickness of between about 200 Å and 2,000 Å.

Once the amorphous silicon material has been deposited to an appropriate thickness, the method will proceed to an operation 606 where a second conductive feature is deposited and patterned over the resistive pads formed in operation 604. At this point, the resistive load structure is complete. Therefore, when a current is applied between the conductive features, a resistive load having a predefined resistance will advantageously result.

Although the foregoing invention has been described in some detail for purposes of clarity of understanding, it will be apparent that certain changes and modifications may be practiced within the scope of the appended claims. Therefore, the present embodiments are to be considered as illustrative and not restrictive, and the invention is not to be limited to the details given herein, but may be modified within the scope and equivalents of the appended claims.

What is claimed is:

1. A static random access memory cell comprising:

a first inverter including a first transistor having a first node and a first control gate, said first inverter further including a first amorphous silicon resistor pad lying over a first conductive via, the first amorphous silicon resistor pad having a resistance of at least $1 \times 10^4$ ohms and a thickness of between about 200 angstroms and about 2,000 angstroms, said first amorphous silicon resistor coupling said first node to a power supply node; and a second inverter including a second transistor having a second node and a second control gate, said second inverter further including a second amorphous silicon resistor pad lying over a second conductive via, the second amorphous silicon resistor pad having a resistance of at least $1 \times 10^4$ ohms and a thickness of between about 200 angstroms and about 2,000 angstroms, said second amorphous silicon resistor coupling said second node to said power supply node, wherein said second inverter is cross-coupled to said first inverter with said first node coupled to said second control gate and said second node coupled to said first control gate.

2. A static random access memory cell as recited in claim 1, further comprising a first pass transistor coupled to said first node, and a second pass transistor coupled to said second node.

3. A static random access memory cell as recited in claim 2, wherein said first amorphous silicon resistor pad and said second amorphous silicon resistor pad are formed using a chemical vapor deposition process.

4. A static random access memory cell as recited in claim 3, wherein the resistance of said first amorphous silicon resistor pad and said second amorphous silicon resistor pad is between about $1 \times 10^4$ and $1 \times 10^{14}$ ohms, and said first and second conductive vias have a diameter of between about 2,000 Å and about 20,000 Å.

5. A static random access memory cell as recited in claim 3, wherein the resistance of said first amorphous silicon resistor pad and second amorphous silicon resistor pad is between about $1 \times 10^4$ and $1 \times 10^{13}$ ohms for thicknesses of between about 200 Å and 1,200 Å, and said first and second conductive vias having a diameter of between about 2,000 Å and about 6,000 Å.

6. A static random access memory cell as recited in claim 5, wherein said first and second conductive vias include a thin conductive layer and a tungsten plug in contact with said thin conductive layer.

7. A static random access memory cell as recited in claim 6, wherein said thin conductive layer is selected from the group consisting of titanium tungsten, tantalum nitride, titanium-tungsten-nitride and tungsten nitride, whereby said thin conductive layer serves as a glue layer for said tungsten plug.

8. A thin film load device, comprising:

means for providing a substrate having a first electrically conductive feature;

means for forming an insulating layer over said first electrically conductive feature;

means for providing a conductive via through said insulating layer in electrically conductive contact with said first electrically conductive feature;

means for depositing an amorphous silicon material having a resistance of at least $1\times10^4$ ohms over and in electrically conductive contact with said conductive via;

means for forming a second electrically conductive feature over and in electrically conductive contact with said amorphous silicon material; and whereby said amorphous silicon material provides a resistive load between said first and second electrically conductive features.

9. A thin film load device as recited in claim 8, wherein said amorphous silicon material is formed using a chemical vapor deposition process.

10. A thin film load device as recited in claim 8, wherein said amorphous silicon material is deposited and patterned into a resistive pad overlying said conductive via.

11. A thin film load device as recited in claim 10, wherein said resistive pad has a resistance of between about $1\times10^4$ and $1\times10^{14}$ ohms for a thickness of between about 200 Å and 2,000 Å, and an underlying conductive via having a diameter of between about 2,000 Å and about 20,000 Å.

12. A thin film load device as recited in claim 10, wherein said resistive pad has a resistance of between about $1\times10^8$ and $1\times10^{13}$ ohms for a thickness of between about 500 Å and 1,200 Å, and an underlying conductive via having a diameter of between about 3,000 Å and about 6,000 Å.

13. A thin film load device as recited in claim 8, wherein said conductive via includes a thin glue layer and a tungsten fill formed in contact with said thin glue layer.

14. A thin film load device as recited in claim 13, wherein said thin glue layer is selected from the group consisting of titanium tungsten, tantalum nitride, titanium-tungsten-nitride and tungsten nitride.

15. A static random access memory cell comprising:

a first inverter including a first transistor having a first node and a first control gate, said first inverter further including a first amorphous silicon pad having a resistance of at least $1\times10^4$ ohms and a thickness ranging between about 200 Å and about 2,000 Å, said first amorphous silicon resistor coupling said first node to a power supply node;

a second inverter including a second transistor having a second node and a second control gate, said second inverter further including a second amorphous silicon pad having a resistance of at least $1\times10^4$ ohms and a thickness ranging between about 200 Å and about 2,000 Å, said second amorphous silicon resistor coupling said second node to said power supply node, such that said second inverter is cross-coupled to said first inverter, with said first node coupled to said second control gate and said second node coupled to said first control gate; and a first pass transistor coupled to said first node, and a second pass transistor coupled to said second node;

wherein said first amorphous silicon pad and said second amorphous silicon pad are formed over conductive vias.

16. A static random access memory cell as recited in claim 15, wherein the conductive vias have a diameter of between about 2,000 Å and about 20,000 Å.

17. A thin film load device, comprising:

a substrate having a first electrically conductive feature;

an insulating layer over said first electrically conductive feature;

a conductive via through said insulating layer in electrically conductive contact with said first electrically conductive feature;

an amorphous silicon material having a resistance of at least $1\times10^4$ ohms over and in electrically conductive contact with said conductive via;

a second electrically conductive feature over and in electrically conductive contact with said amorphous silicon material; and whereby said amorphous silicon material provides a resistive load between said first and second electrically conductive features.

18. A thin film load device as recited in claim 17, wherein said amorphous silicon material is formed using a chemical vapor deposition process.

19. A thin film load device as recited in claim 17, wherein said conductive via includes a thin glue layer and a tungsten fill formed in contact with said thin glue layer.

20. A thin film load device as recited in claim 19, wherein said thin glue layer is selected from the group consisting of titanium tungsten, tantalum nitride, titanium-tungsten-nitride and tungsten nitride.

21. A thin film load device as recited in claim 17, wherein a memory device includes the thin film load device.

22. A thin film load device as recited in claim 21, wherein a memory device is an SRAM cell.

23. A thin film load device as recited in claim 17, wherein said amorphous silicon material is deposited and patterned into a resistive pad overlying said conductive via.

24. A thin film load device as recited in claim 23, wherein said resistive pad has a resistance of between about $1\times10^4$ and $1\times10^{14}$ ohms for a thickness of between about 200 Å and 2,000 Å, and an underlying conductive via having a diameter of between about 2,000 Å and about 20,000 Å.

25. A thin film load device as recited in claim 23, wherein said resistive pad has a resistance of between about $1\times10^8$ and $1\times10^{13}$ ohms for a thickness of between about 500 Å and 1,200 Å, and an underlying conductive via having a diameter of between about 3,000 Å and about 6,000 Å.

* * * * *